US006975552B2

(12) United States Patent
Kim

(10) Patent No.: US 6,975,552 B2
(45) Date of Patent: Dec. 13, 2005

(54) HYBRID OPEN AND FOLDED DIGIT LINE ARCHITECTURE

(75) Inventor: Tae H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/644,610

(22) Filed: Aug. 19, 2003

(65) Prior Publication Data

US 2005/0041512 A1 Feb. 24, 2005

(51) Int. Cl.[7] .................................................. G11C 8/00
(52) U.S. Cl. ..................... 365/230.03; 365/63; 365/205
(58) Field of Search ............................ 365/230.03, 63, 365/205, 149

(56) References Cited

U.S. PATENT DOCUMENTS

| | | | | |
|---|---|---|---|---|
| 5,625,585 A | * | 4/1997 | Ahn et al. ..................... 365/63 |
| 5,732,010 A | * | 3/1998 | Takashima et al. ........... 365/63 |
| 5,864,181 A | | 1/1999 | Keeth ......................... 257/776 |
| 6,043,562 A | | 3/2000 | Keeth ......................... 257/776 |
| 6,301,172 B1 | * | 10/2001 | Derner et al. ............... 365/201 |
| 6,304,479 B1 | * | 10/2001 | Vollrath et al. ............... 365/63 |
| 6,574,128 B1 | * | 6/2003 | Morgan ........................ 365/72 |
| 2004/0095795 A1 | | 5/2004 | Tran ............................. 365/63 |

OTHER PUBLICATIONS

Kirihata, T. et al., "A 113mm$^2$ 600Mb/s/pin 512Mb DDR2 SDRAM with Vertically–Folded Bitline Architecture", IEEE International Solid State Circuits Conference Feb. 2001, pp. 382–383 and 468.

Yoon, H. et al., "A 4Gb DDR SDRAM with Gain–Controlled Pre–Sensing and Reference Bitline Calibration Schemes in the Twisted Open Bitline Architecture", IEEE International Solid–State Circuits Conference, Feb. 2001, pp. 378–379 and 467.

* cited by examiner

Primary Examiner—Hoai Ho
(74) Attorney, Agent, or Firm—Dorsey & Whitney LLP

(57) ABSTRACT

A digit line architecture for an array of memory cells exhibiting characteristics of both folded digit line architectures and an open digit line architectures. The digit line architecture includes first and second digit lines having first and second digit line segments. The memory cells of a column are coupled to the first digit line segments. The second digit line segment of the first digit line is located in the memory sub-array with which the column is associated and the second digit line segment of the second digit line extending into the other memory sub-array with which the column is not associated.

54 Claims, 5 Drawing Sheets

HYBRID OPEN AND FOLDED DIGIT LINE ARCHITECTURE

TECHNICAL FIELD

The present invention relates generally to memory devices, and more particularly, to digit line architectures for use in memory devices.

BACKGROUND OF THE INVENTION

Memory devices, such as dynamic random access memories ("DRAMs"), include one or more arrays of memory cells arranged in rows and columns. Each array may be divided into several sub-arrays. Typically, one or more digit or "bit" lines are provided for each column of the array, and each digit line is coupled to a respective sense amplifier. Each sense amplifier is generally a differential amplifier that compares the voltage at one of its inputs to the voltage at the other of its inputs. The sense amplifier then drives its inputs to complementary logic levels corresponding to the sensed differential voltage.

There are currently two array architectures that are commonly used in memory devices, such as DRAMs. In an "open" digit line architecture, the digit lines span two adjacent sub-arrays, and each digit line is coupled to each memory cell in a respective column. A sense amplifier is coupled to the digit lines of two adjacent sub-arrays. Thus, each sense amplifier is shared by two sub-arrays so that one input to the sense amplifier is coupled to the digit line of one array and the other input to the sense amplifier is coupled to the digit line of the other array. Prior to a memory read operation, the digit lines are precharged to a voltage that is typically one-half of an internal supply voltage, commonly referred to as DVC2.

In response to a memory read operation, one of the digit lines coupled to a sense amplifier is coupled to a memory cell being read. In response, the voltage on the digit line either increases or decreases from DVC2 depending upon the logic level stored in the memory cell. The other digit line remains at the precharge voltage, DVC2. The sense amplifier detects that the voltage on the digit line coupled to the memory cell being read has either increased or decreased relative to the precharge voltage and then drives the digit lines to complimentary logic levels corresponding to the sensed voltage.

The other architecture that is commonly used in memory device arrays is the "folded" digit line architecture. In a folded digit line architecture, each column is provided with a pair of complimentary digit lines, and the digit lines of each pair are generally coupled to alternate memory cells in the same sub-array. The complimentary digit lines are coupled to the inputs of a respective sense amplifier. Thus, the digit lines coupled to each sense amplifier are from the same sub-array.

A memory read operation in a folded digit line architecture is essentially the same as in an open digit line architecture. More specifically, the digit lines of each column are initially precharged to DVC2. In response to a memory read command, one of the digit lines coupled to the sense amplifier is coupled to a memory cell being read. In response, the voltage on the digit line either increases or decreases depending upon the logic level stored in the memory cell. The other digit line remains at the precharge voltage. The sense amplifier detects that the voltage on the digit line coupled to the memory cell being read has either increased or decreased relative to the precharge voltage. The sense amplifier then drives both digit lines to complementary logic levels corresponding to the sensed voltage.

Each of the above-described architectures has its advantages and disadvantages. A disadvantage of the open digit line architecture relative to the folded digit line architecture is that it is susceptible to errors resulting from noise because each sense amplifier input is coupled to a different array. In contrast, since both digit lines coupled to a sense amplifier in a folded digit line architecture extend closely adjacent each other through the same array, they tend to pick up the same noise signals. The differential operation of the sense amplifiers thus makes them insensitive to these common mode noise signals.

Although folded digit line architectures have better noise immunity, they have a significant disadvantage compared to open-array architectures in that they are less area efficient. Due to the nature of the layout of a folded architecture, each memory cell occupies $8F^2$ in area, where "F" is the minimum feature size of the semiconductor process. The layout of an open array architecture allows for a $6F^2$ cell area, thereby resulting in a 25% reduction over the $8F^2$ cell. Thus, open digit line architectures are theoretically substantially more area efficient than folded digit line architectures in using the surface area of a semiconductor die. Additionally, folded digit line architectures are susceptible to coupling with adjacent digit lines of the same array. As previously discussed, when a row of memory for an array is activated, all of the columns of memory cells are activated for that array. As a result, for a folded digit line architecture, coupling between the adjacent digit lines in the active array will result in higher currents and decreased sensitivity of the sense amplifiers.

In order to reduce digit line coupling in a folded digit line architecture, digit line pairs can be "twisted" at one or more places to reduce and balance the coupling to adjacent digit line pairs. The twisting improves the signal-to-noise characteristics. A variety of twisting schemes are used throughout the industry, as well known, resulting in each digit line pair is surrounded on two sides by other digit line pairs. Ideally, a twisting scheme will equalize the coupling terms from each digit line to all other digit lines. If done properly, the noise terms cancel, or at the very least, produce only common mode noise to which the differential sense amplifier is immune. However, each digit line twist region occupies valuable silicon area.

Therefore, there is a need for an alternative digit line architecture for use in memory devices.

SUMMARY OF THE INVENTION

According to one aspect of the invention, a digit line architecture for a memory array is provided. The memory array in which the digit line architecture can be used includes at least two memory sub-arrays in which the memory cells are arranged in rows and columns, and the two memory sub-arrays share sense amplifiers of a sense amplifier region separating the two memory sub-arrays. The digit line architecture includes first and second digit lines having first and second digit line segments. The memory cells of a column are coupled to the first digit line segments. The second digit line segment of the first digit line is located in the memory sub-array with which the column is associated and the second digit line segment of the second digit line extending into the other memory sub-array with which the column is not associated.

In another aspect of the invention, a method for forming columns of memory cells having first and second digit lines for an array of memory cells is provided. The method includes forming first digit line segments to which the memory cells are coupled of the first and second digit lines in a first memory array region and forming a second digit line segment of the first digit line in the first memory array region. The method further includes forming a second digit line segment of the second digit line extending into a second memory array region non-adjoining the first memory array region.

DETAILED DESCRIPTION OF THE INVENTION

Embodiments of the present invention are directed to a digit line architecture for use in memory devices, preferably in memory devices employing a $6F^2$ memory cell structure. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention. It will be further appreciated that the lateral distances of the various functional blocks illustrated in the accompanying figures are not drawn to scale and may have been enlarged or reduced to improve drawing legibility.

Figure 1:
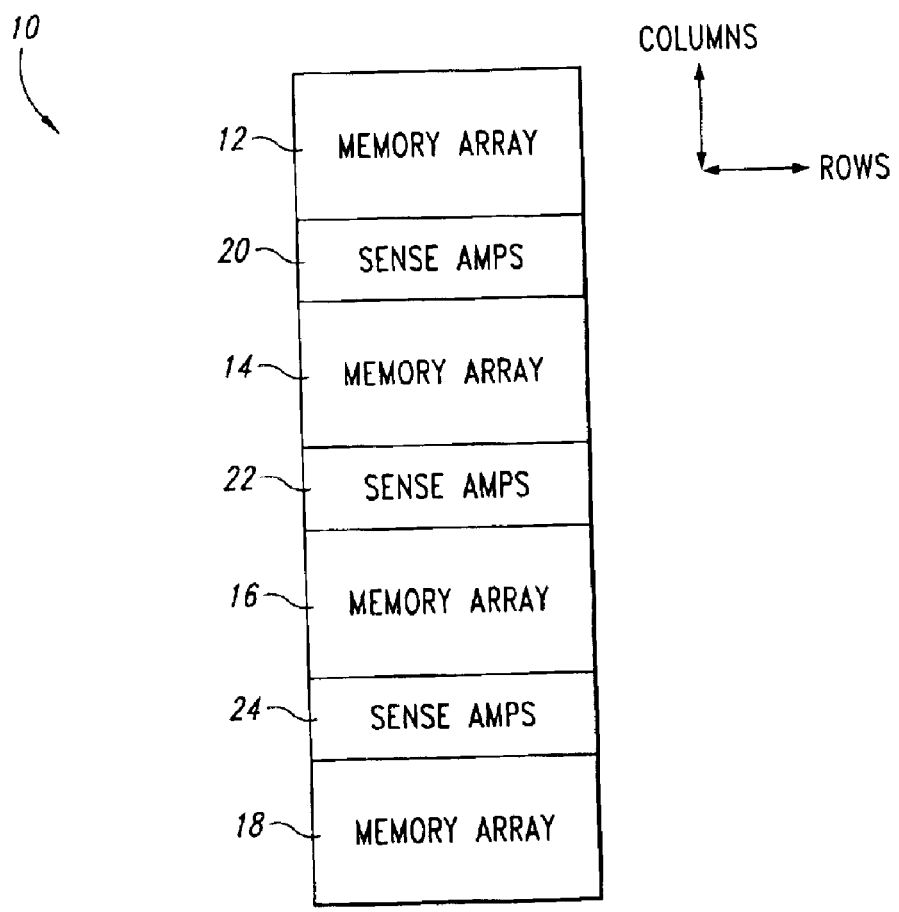
FIG. 1 is a partial block diagram of a memory array employing a digit line architecture according to an embodiment of the present invention.

FIG. 1 illustrates a partial block diagram of a memory array 10. The portion of the memory array 10 that is shown includes memory arrays 12, 14, 16, 18. The memory array 10 further includes three sets of sense amplifiers 20, 22, 24. The set of sense amplifiers 20 is shared by memory arrays 12, 14, the set of sense amplifiers 22 is shared by memory arrays 14, 16, and the set of sense amplifiers 24 is shared by memory arrays 16, 18. Although not shown in detail, each of the memory arrays 12, 14, 16, 18 include memory cells arranged in rows and columns of memory cells. The rows of memory cells are coupled to respective row decoder circuitry for selection and activation, as well known in the art. The columns of memory cells, each of which extends across the memory array, are coupled to a respective sense amplifier of the set of sense amplifiers 20, 22, 24. As will be explained in greater detail below, each sense amplifier of the set of sense amplifiers 20, 22, 24 is coupled to a column of memory cells from two different memory arrays.

Figure 2:
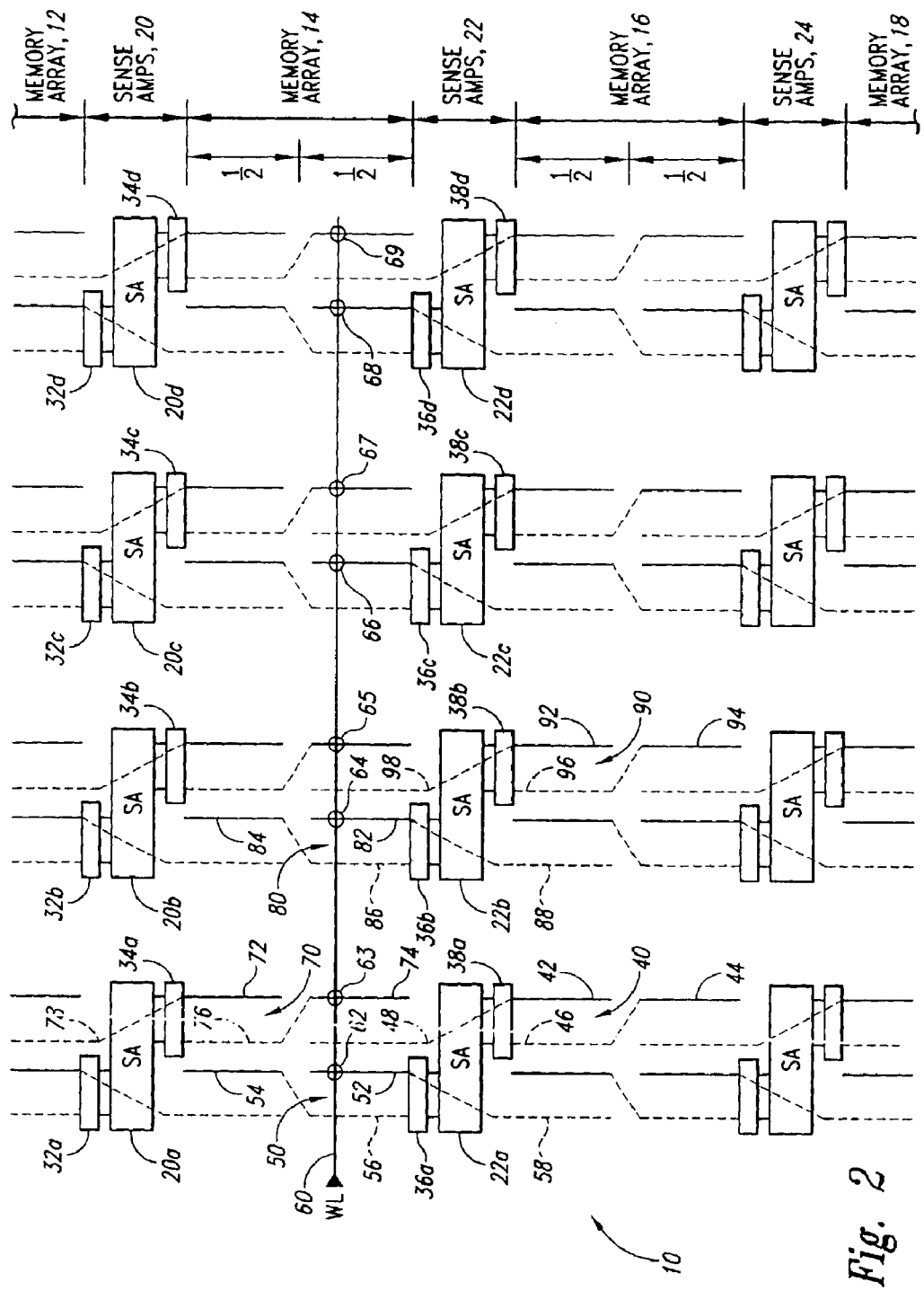
FIG. 2 is a functional block diagram of the partial memory array of FIG. 1 showing in greater detail the digit line architecture according to an embodiment of the present invention.

FIG. 2 is a block diagram of a portion of the memory array 10 showing greater detail of the digit line architecture, and the coupling of columns of memory cells of the memory arrays 12, 14, 16, 18, to the sets of sense amplifiers 20, 22, 24 according to an embodiment of the present invention. The digit lines of each column of memory cells include first and second digit line portions or segments. The first digit line portion is preferably a buried digit line (BDL), the construction of which is well known in the art, and the second portion is preferably a metal digit line (MDL) formed from a subsequent metal layer, which is also well known in the art. In FIG. 2, the BDL portions of the digit lines are represented by solid lines, and the MDL portions of the digit lines are represented by dashed lines. Significantly, for each column of memory, the BDL portions of a column of memory are located within the same memory array while the MDL portions of the column are located in different memory arrays. For example, with respect to a column 40 of the memory array 16, first and second BDL portions 42, 44 and a first MDL portion 46 of the column 40 are located in the memory array 16, and a second MDL portion 48 of the column 40 is located in the memory array 14. Thus, it will be appreciated that the digit line architecture of embodiments of the present invention, such as that of the memory array 10 shown in FIG. 2, have characteristics of both a folded digit line architecture and an open digit line architecture.

As shown in FIG. 2, each of the BDL portions of a column extend across approximately one-half of a memory array. In the embodiment shown with respect to FIG. 2, the memory cells of a column of memory are coupled to the BDL portions of a column. It will be appreciated, however, that modifications can be made, such as varying the portion of a memory array across which each BDL portion of a column extends or to which portion of a digit line memory cells are coupled, without departing from the scope of the present invention.

As previously mentioned, the digit line architecture of embodiments of the present invention provide characteristics of both open and folded digit line architectures. For example, since the BDL portions of a column are located in the same memory array (i.e., demonstrating aspects of a folded digit line architecture) a certain degree of noise immunity is provided. Additionally, since the MDL portions of the column are located in different memory arrays (i.e., demonstrating aspects of a open digit line architecture) there is reduced digit line coupling. Moreover, the MDL portion that extends into the memory array not including the BDL portions provides capacitive balance to the MDL portion in the same memory array in which the BDL portions are located.

In FIG. 2, included in the set of sense amplifiers 20 are sense amplifiers 20a–d and included in the set of sense amplifiers 22 are sense amplifiers 22a–d. Each of the sense amplifiers 20a–d is coupled to a respective pair of isolation circuits 32a–d, 34a–d, and each of the sense amplifiers 22a–d is coupled to a respective pair of isolation circuits 36a–d, 38a–d for coupling to two columns of memory cells. As previously discussed, each of the sense amplifiers 20a–d, 22a–d is coupled to two columns of memory cells, each of which is associated with a different memory array. For example, the sense amplifier 22a is coupled to a column of memory 50 of the memory array 14 through the isolation circuit 36a, and is further coupled to the column of memory 40 of the memory array 16 through the isolation circuit 38a.

In operation, the sensing operation of the memory array 10 is similar to conventional sensing operations. For example, a word line 60 of a row of memory cells is activated in the memory array 10, thus, coupling the memory cells 62–69 to the BDL portions of the active columns of memory. As a result, the voltage of the digit line will change from a precharge voltage based on the data state stored by the respective memory cell. Following the activation of the word line 60, the digit lines of the accessed columns of memory are coupled through the isolation circuits to a respective sense amplifier. The sense amplifier compares the voltage of the digit line to which the memory cell is coupled and the voltage of the second digit line of the pair (which has a voltage at the precharge voltage), and amplifies the voltage difference between the two digit lines to complete the sensing operation.

With specific reference to memory cell 62, the memory cell 62 is coupled to the BDL portion 52 of the column 50 when the word line 60 is activated. The data state stored by the memory cell 62 will change the voltage of the digit line having the BDL portion 52 and the MDL portion 58 from the precharge voltage. The isolation circuit 36a couples the digit line having the BDL portion 54 and the MDL portion 56, and the digit line having the BDL portion 52 and the MDL portion 58 to the sense amplifier 22a for sensing. Significantly, the BDL portions 52, 54 of the column 50 are located within the same memory array, namely, the memory array 14. However, the MDL portions of the column 50 are located in two different memory arrays, with the MDL portion 56 located in the memory array 14, and the MDL portion 58 located in the memory array 16.

With specific reference to the memory cell 63, upon activation of the word line 60, the memory cell 63 is coupled to the digit line having the BDL portion 74 and the MDL portion 76. As a result, the voltage of the digit line will be altered by the data state stored by the memory cell 63. The isolation circuit 34a is activated, and couples the digit lines of the column 70 to the sense amplifier 20a for the sensing operation. More specifically, the voltage of the digit line having the BDL portion 74 and MDL portion 76 is compared to the precharge voltage of the digit line having the BDL portion 72 and the MDL portion 78. The voltage difference is then amplified by the sense amplifier 20a. As with the arrangement of the column 50, the arrangement of the column 70 has BDL portions 72, 74 of each digit line of the pair located in the same memory array 14, and the MDL portion of one digit line located in the memory array 14 and the MDL portion of the other digit line located in another memory array. In the case of the column 70, MDL portion 78 extends into the memory array 12.

As previously discussed, by having the BDL portions of the digit lines of a column in the same memory array, and the MDL portions of the digit lines of the column in different memory arrays, the digit line architecture shown in FIG. 2 provides benefits related to both folded and open digit line architectures. Moreover, the digit lines of a column are balanced in that each digit line of the pair includes both BDL and MDL portions. It will be further appreciated that the digit line architecture shown in FIG. 2 can be used with memory arrays employing a $6F^2$ memory cell structure. Additionally, the digit line architecture of FIG. 2 can be formed such that the MDL portions of the active columns of a memory array are interleaved with the MDL portions of inactive columns located in other memory arrays, thus, providing greater noise immunity. For example, with respect to active column 50, 80 and inactive columns 40, 90, the MDL portion 86 can be flanked by the MDL portions 48, 98, and the MDL portion 88 can be flanked by the MDL portions 46, 96.

It will be appreciated by those ordinarily skilled in the art that a memory array having a digit line architecture according to an embodiment of the present invention can be fabricated through the use of conventional semiconductor fabrication techniques and processes well known in the art. It will be further appreciated that those of ordinary skill in the art will obtain sufficient understanding from the description provided herein to enable them to practice embodiments of the present invention.

Figure 3:
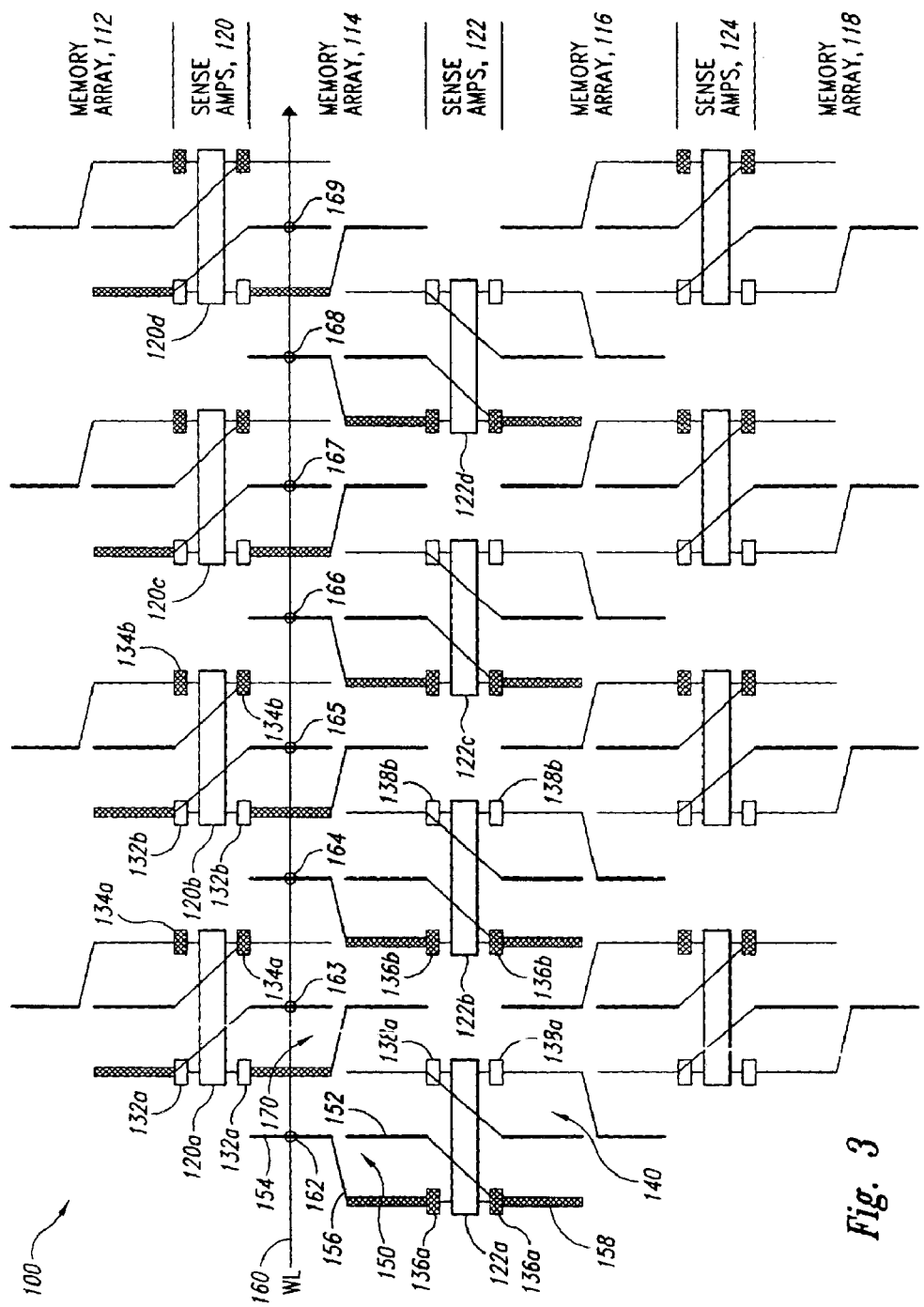
FIG. 3 is a functional block diagram of a memory array showing a digit line architecture according to an alternate embodiment of the present invention.

FIG. 3 shows a portion of a memory array 100 employing a digit line architecture according to an alternative embodiment of the present invention. The portion of the memory array 100 shown in FIG. 3 includes memory arrays 112, 114, 116, 118 sharing sets of sense amplifiers 120, 122, 124. As with the embodiment discussed with respect to FIG. 2, for each column of memory, each digit line of a digit line pair for a column of memory includes two digit line portions. That is, first digit line portions located within the same memory array, and second digit line portions located in different memory arrays. In the memory array 100, the first portion represented by buried digit line (BDL) portions, shown in FIG. 3 as having bold line thickness, and the second digit line portion represented by metal digit line (MDL) portions, shown in FIG. 3 as having plain line thickness.

Although the memory array 100 of FIG. 3 is similar to that of the memory array 10 of FIG. 2, the memory array 100 illustrates a slightly different memory array arrangement. For example, sense amplifiers of the sets of sense amplifiers 120, 122, 124 are offset relative to one another. That is, sense amplifiers 120a–d are not positioned in-line with sense amplifiers 122a–d, but are instead, shifted relative to the position of the sense amplifiers 122a–d. Additionally, in the memory array 100, isolation circuits for coupling a pair of digit lines to a sense amplifier are located adjacent to different memory arrays. For example, isolation circuit 136a, which couples the digit lines of column 150 to the sense amplifier 122a, has a first switch located adjacent to the memory array 114 coupling the digit line having BDL portion 154 and MDL portion 156 to the sense amplifier 122a, and a second switch located adjacent to the memory array 116 coupling the digit line having BDL portion 152 and MDL portion 158 to the sense amplifier 122a. The arrangement of the memory array 100 may be preferred in situations where alternative semiconductor layouts or structures to that shown in FIG. 2 are desired. For example, where alternative routing of the digit lines through the sense amplifier region may be desired, or where alternative coupling between the BDL and MDL portions may be desired. However, it will be appreciated that FIGS. 2 and 3 are representative of embodiments of the present invention, and are not intended to limit the scope of the present invention to any particular embodiment described herein. It will be further appreciated that conventional fabrication techniques and processes can be used in forming the digit line architecture shown in FIG. 3, and that those ordinarily skilled in the art will obtain sufficient understanding from the description provided herein to practice the invention.

Operation of the memory array 100 is similar to the previously discussed operation of the memory array 10. A word line 160 of a row of memory cells in the memory array 114 is activated, thereby coupling memory cells 162–169 to a respective digit line of the active columns of memory. The digit lines of the active columns are coupled to a respective sense amplifier through respective isolation circuits for the sensing operation. Voltage differences between the digit line to which the memory cells 162–169 are coupled and the other digit line of the pair are detected and amplified by the sense amplifiers. With specific reference to the memory cell 162, when the word line 160 is activated, the memory cell 162 is coupled to the digit line having BDL portion 154 and MDL portion 156. virtue of the data state stored by the memory cell 162. The isolation circuits 136a are then activated to couple the digit line to which the memory cell 162 is coupled, and the digit line having BDL portion 152 and MDL portion 158 to the sense amplifier 122a for the sensing operation. In response, the sense amplifier 122a detects and amplifies the relative voltage difference between the digit lines of the column 150. Significantly, the BDL portions 152, 154 are located in the same memory array 114, and the MDL portions 156, 158 are located in different memory arrays, namely the memory array 114 and 116, respectively. As shown in FIG. 3, the MDL portions of the active columns of memory are shown in shaded cross-hatching. It is apparent that while the BDL portions of a digit line pair are located in the same memory array, the MDL portions of the digit lines of the pair are located in different memory arrays. As a result, it will be appreciated that the digit line architecture of the memory array 100, like the digit line architecture of the memory array 10 (FIG. 2), provides characteristics of both folded and open digit line architectures.

Figure 4:
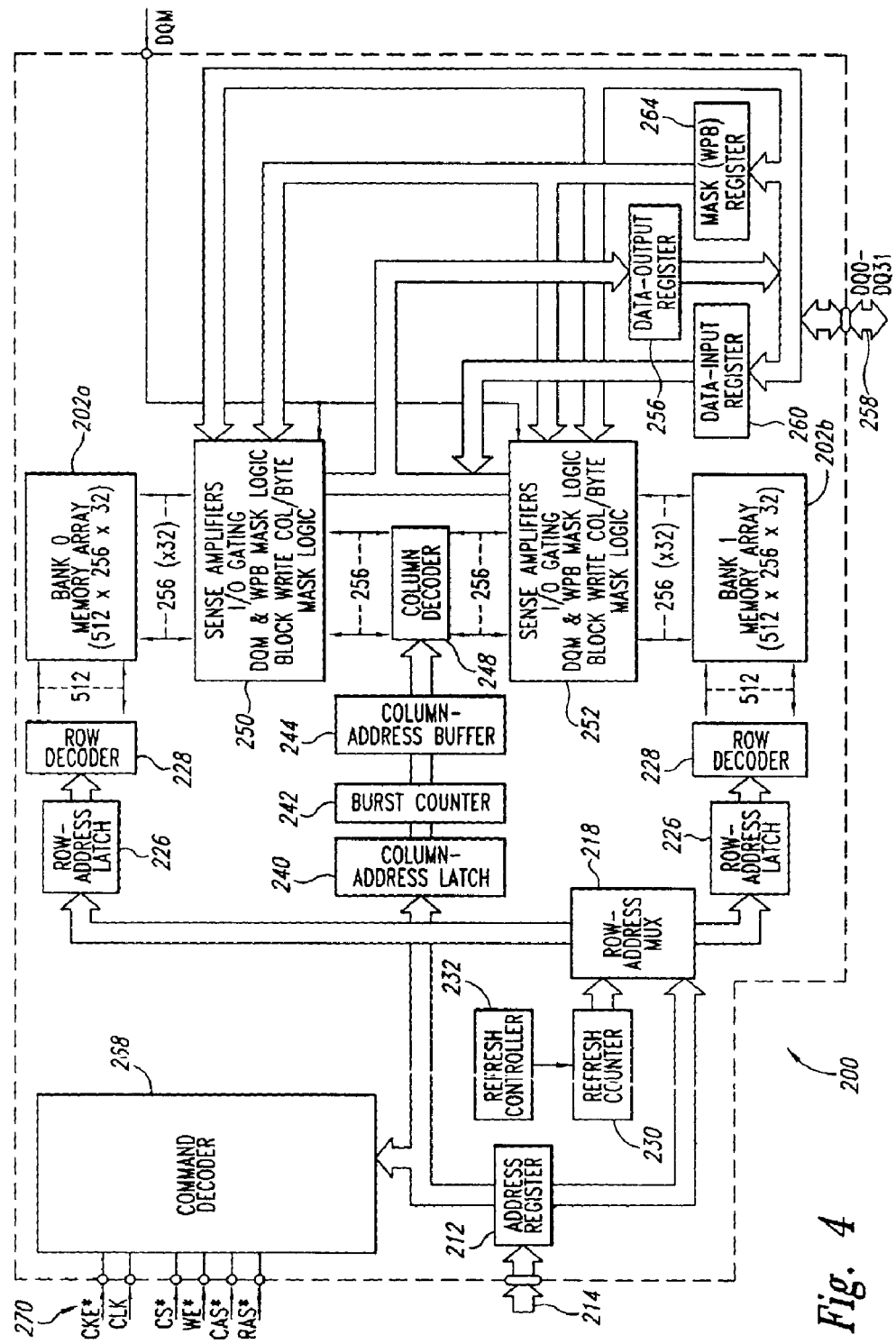
FIG. 4 is a block diagram of a memory device using the memory array of FIGS. 2 or 3.

One embodiment of a memory device 200 having a memory array 202 employing a digit line architecture according to an embodiment of the present invention, for example, such as that shown in FIGS. 2 and 3, is illustrated in FIG. 4. The memory device shown in FIG. 4 is synchronous dynamic random access memory ("SDRAM") 200, although embodiments of the present invention may be used in other DRAMs and other memory devices. The SDRAM 200 includes an address register 212 that receives either a row address or a column address on an address bus 214. The address bus 214 is generally coupled to a memory controller (not shown in FIG. 1). Typically, a row address is initially received by the address register 212 and applied to a row address multiplexer 218. The row address multiplexer 218 couples the row address to a number of components associated with either of two memory arrays 202a, 202b, depending upon the state of a bank address bit forming part of the row address. As mentioned above, the memory arrays 202a, 202b employ a digit line architecture according to an embodiment of the present invention. Associated with each of the memory arrays 202a, 202b is a respective row various signals to its respective memory array 202a, 202b as a function of the stored row address. The row address multiplexer 218 also couples row addresses to the row address latches 226 for the purpose of refreshing the memory cells in the memory arrays 202a, 202b. The row addresses are generated for refresh purposes by a refresh counter 230, which is controlled by a refresh controller 232.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242, which applies a sequence of column addresses to the column address buffer 244 starting at the column address that is stored in the column-address latch. In either case, the column address buffer 244 applies a column address to a column decoder 248, which applies various column signals to respective sense amplifiers and associated column circuitry 250, 252 for the respective memory arrays 202a, 202b.

Data to be read from one of the memory arrays 202a, 202b are coupled to the column circuitry 250, 252 for one of the memory arrays 202a, 202b, respectively. The data are then coupled to a data output register 256, which applies the data to a data bus 258. Data to be written to one of the memory arrays 202a, 202b are coupled from the data bus 258 through a data input register 260 to the column circuitry 250, 252 and then are transferred to one of the memory arrays 202a, 202b, respectively. A mask register 264 may be used to selectively alter the flow of data into and out of the column circuitry 250, 252, such as by selectively masking data to be read from the memory arrays 202a, 202b.

The above-described operation of the SDRAM 200 is controlled by a command decoder 268 responsive to high level command signals received on a control bus 270. These high level command signals, which are typically generated by a memory controller (not shown in FIG. 4), are a clock enable signal CKE*, a clock signal CLK, a chip select signal CS*, a write enable signal WE*, a column address strobe signal CAS*, and a row address strobe signal RAS*, with the "*" designating the signal as active low or complement. The command decoder 268 generates a sequence of control signals responsive to the high level command signals to carry out the function (e.g., a read or a write) designated by each of the high level command signals. These control signals, and the manner in which they accomplish their respective functions, are conventional. Therefore, in the interest of brevity, a further explanation of these control signals will be omitted.

Figure 5:
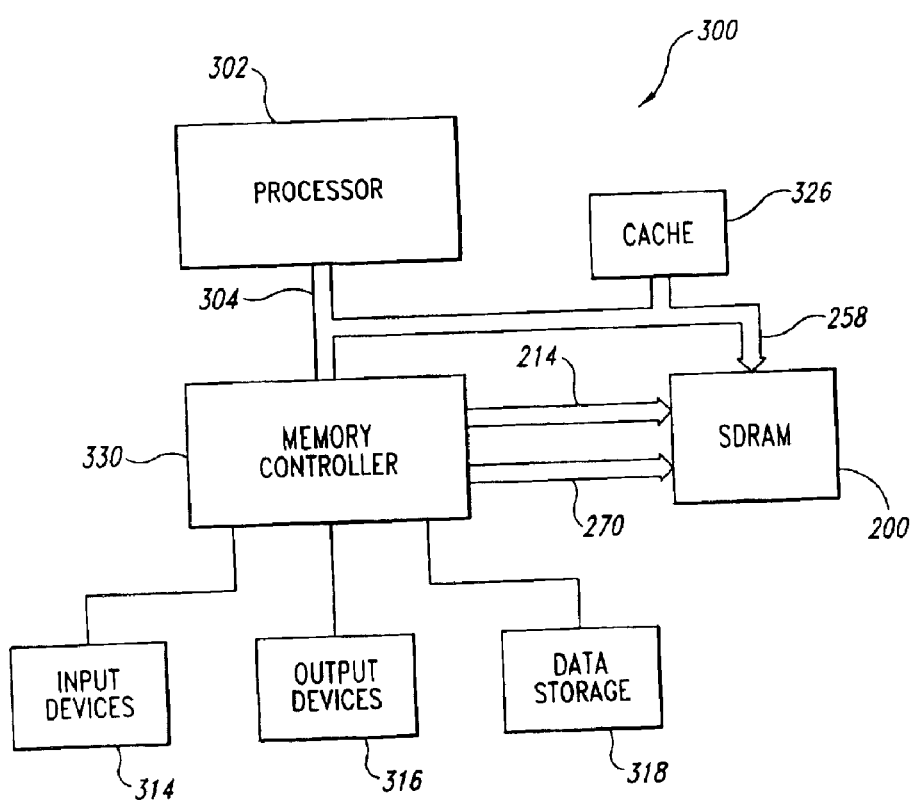
FIG. 5 is a block diagram of a computer system using the memory device of FIG. 4.

One embodiment of a computer system 300 using the SDRAM 200 shown in FIG. 4 is shown in FIG. 5. The computer system 300 includes a processor 302 for performing various computing functions, such as executing specific software to perform specific calculations or tasks. The processor 302 includes a processor bus 304 that normally includes the address bus 214, the data bus 258, and the control bus 270 (FIG. 4). In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data or retrieve data from internal or external storage media (not shown). Examples of typical storage devices 318 include hard and floppy disks, tape cassettes and compact disk read-only memories (CD-ROMs). The processor 302 is also typically coupled to cache memory 326, which is usually static random access memory ("SRAM") and to the SDRAM 200 through a memory controller 330. The memory controller 330 normally includes the control bus 270 and the address bus 214 that is coupled to the SDRAM 200. The data bus 258 may be coupled to the processor bus 304 either directly (as shown), through the memory controller 330, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. In a memory device having first and second memory arrays sharing sense amplifiers of a sense amplifier region, each memory array having memory cells arranged in rows and columns of memory cells, a column of memory cells comprising:

first and second digit lines coupled to a sense amplifier, each digit line having first and second digit line portions, the first digit line portions of the first and second digit lines associated with the first memory array, the second digit line portion of the first digit line associated with the first memory array, and the second digit line portion of the second digit line associated with the second memory array; and a plurality of memory cells coupled to the first and second digit lines.

2. The column of memory cells of claim 1 wherein the first digit line portions of the first and second digit lines comprise buried digit lines and the second digit line portions of the first and second digit lines comprise digit lines formed from a metal material.

3. The column of memory cells of claim 1 wherein the plurality of memory cells coupled to the first digit line portions comprises a plurality of memory cells having a 6F² semiconductor structure.

4. The column of memory cells of claim 1 wherein the first digit line portions of the first and second digit lines comprise digit lines formed from a first conductive material and the second digit line portions of the first and second digit lines comprise digit lines formed from a second conductive material.

5. The column of memory cells of claim 1 wherein the first digit line is coupled to the sense amplifier through an isolation switch formed adjacent to the first memory array and the second digit line is coupled to the sense amplifier through an isolation switch formed adjacent to the second memory array.

6. The column of memory cells of claim 1 wherein the plurality of memory cells comprises a plurality of memory cells coupled to the first portions of the first and second digit lines.

7. The column of memory cells of claim 1 wherein the first portion of the second digit line is coupled to the sense amplifier through the second portion of the second digit line.

8. A digit line architecture for an array of memory cells having at least two memory sub-arrays in which the memory cells are arranged in rows and columns, and the two memory sub-arrays share sense amplifiers of a sense amplifier region separating the two memory sub-arrays, the digit line architecture comprising:

first and second digit lines having first and second digit line segments, the memory cells of a column coupled to the first digit line segments, the second digit line segment of the first digit line located in the memory sub-array with which the column is associated and the second digit line segment of the second digit line extending into the other memory sub-array with which the column is not associated.

9. A semiconductor memory array, comprising:

a sense amplifier region having a plurality of sense amplifiers located therein; and first and second memory cell regions in which memory cells are arranged in rows and columns of memory cells, the first and second memory cell regions disposed on opposite sides of the sense amplifier region and having columns of memory coupled to a respective sense amplifier, each column of memory having first and second digit lines having first and second digit line segments, the columns of memory of the first memory cell region having the first digit line segments of the first and second digit lines disposed in the first memory cell region, the second digit line segment of the first digit line disposed in the first memory cell region, and the second digit line segment of the second digit line disposed in the second memory cell region.

10. The semiconductor memory array of claim 9 wherein the columns of memory of the second memory cell region comprise first and second digit lines having first and second digit line segments, the first digit line segments of the first and second digit lines of the columns of the second memory cell region disposed in the second memory cell region, the second digit line segment of the first digit line of the columns of the second memory cell region disposed in the second memory cell region, and the second digit line segment of the second digit line of the columns of the second memory cell region disposed in the first memory cell region.

11. The semiconductor memory array of claim 9 wherein the first digit line segments of the first and second digit lines of a column of memory comprise buried digit lines and the second digit lines segments of the first and second digit lines of a column of memory comprise digit lines formed from a metal material.

12. The semiconductor memory array of claim 9 wherein the memory cells of the first and second memory cell regions comprise memory cells having a 6F² semiconductor structure.

13. The semiconductor memory array of claim 9 wherein the first digit line segments of the first and second digit lines of a column of memory comprise digit lines formed from a first conductive material and the second digit line portions of the first and second digit lines of a column comprise digit lines formed from a second conductive material.

14. The semiconductor memory array of claim 9 wherein the first digit line of a column of memory is coupled to a respective sense amplifier through an isolation switch formed adjacent to the first memory cell region and the second digit line of a column is coupled to the sense amplifier through an isolation switch formed adjacent to the second memory cell region.

15. The semiconductor memory array of claim 9 wherein the memory cells of the first and second memory cell regions comprise memory cells coupled to the first portions of the first and second digit lines of the columns of memory.

16. The semiconductor memory array of claim 9 wherein the first portion of the second digit line of a column of memory is coupled to a respective sense amplifier through the second portion of the second digit line.

17. The semiconductor memory array of claim 9 wherein the first segments of the first and second digit lines of a column of memory extend across approximately one-half of the memory cell region in which the column is located.

18. A memory array, comprising:

first and second memory sub-arrays of memory cells, the memory cells of each sub-array arranged in rows and columns of memory cells, each column of memory having first and second digit lines coupled to a sense amplifier, each digit line having first and second digit line portions, the columns of memory of the first memory sub-array having the first digit line portions of the first and second digit lines associated with the first memory sub-array, the second digit line portion of the first digit line associated with the first memory array, and the second digit line portion of the second digit line associated with the second memory sub-array.

19. The memory array of claim 18 wherein the columns of memory of the second memory sub-array comprise first and second digit lines having first and second digit line portions, the first digit line segments of the first and second digit lines of the columns of the second memory sub-array disposed in the second memory cell region, the second digit line segment of the first digit line of the columns of the second memory sub-array disposed in the second memory cell region, and the second digit line segment of the second digit line of the columns of the second memory sub-array disposed in the first memory cell region.

20. The memory array of claim 18 wherein the first digit line segments of the first and second digit lines of a column of memory comprise buried digit lines and the second digit lines segments of the first and second digit lines of a column of memory comprise digit lines formed from a metal material.

21. The memory array of claim 18 wherein the memory cells of the first and second memory sub-arrays comprise memory cells having a $6F^2$ semiconductor structure.

22. The memory array of claim 18 wherein the first digit line segments of the first and second digit lines of a column of memory comprise digit lines formed from a first conductive material and the second digit line portions of the first and second digit lines of a column comprise digit lines formed from a second conductive material.

23. The memory array of claim 18 wherein the first digit line of a column of memory is coupled to a respective sense amplifier through an isolation switch formed adjacent to the first memory sub-array and the second digit line of a column is coupled to the sense amplifier through an isolation switch formed adjacent to the second memory sub-array.

24. The memory array of claim 18 wherein the memory cells of the first and second memory sub-arrays comprise memory cells coupled to the first portions of the first and second digit lines of the columns of memory.

25. The memory array of claim 18 wherein the first portion of the second digit line of a column of memory is coupled to a respective sense amplifier through the second portion of the second digit line.

26. The memory array of claim 18 wherein the first segments of the first and second digit lines of a column of memory extend across approximately one-half of the memory sub-array in which the column is located.

27. A memory device, comprising:
a memory array having first and second memory sub-arrays of memory cells, the memory cells of each sub-array arranged in rows and columns of memory cells, each column of memory having first and second digit lines coupled to a sense amplifier, each digit line having first and second digit line portions, the columns of memory of the first memory sub-array having the first digit line portions of the first and second digit lines associated with the first memory sub-array, the second digit line portion of the first digit line associated with the first memory array, and the second digit line portion of the second digit line associated with the second memory sub-array;
an address decoder receiving a memory address at an external terminal, the address decoder being operable to activate a row and column in the array corresponding to the memory address; and
a data path operable to couple read data from an external terminal to the memory array and write data from the memory array to the external terminal.

28. The memory device of claim 27 wherein the columns of memory of the second memory sub-array comprise first and second digit lines having first and second digit line portions, the first digit line segments of the first and second digit lines of the columns of the second memory sub-array disposed in the second memory cell region, the second digit line segment of the first digit line of the columns of the second memory sub-array disposed in the second memory cell region, and the second digit line segment of the second digit line of the columns of the second memory sub-array disposed in the first memory cell region.

29. The memory device of claim 27 wherein the first digit line segments of the first and second digit lines of a column of memory of the memory array comprise buried digit lines and the second digit lines segments of the first and second digit lines of a column of memory comprise digit lines formed from a metal material.

30. The memory device of claim 27 wherein the memory cells of the first and second memory sub-arrays of the memory array comprise memory cells having a $6F^2$ semiconductor structure.

31. The memory device of claim 27 wherein the first digit line segments of the first and second digit lines of a column of memory of the memory array comprise digit lines formed from a first conductive material and the second digit line portions of the first and second digit lines of a column comprise digit lines formed from a second conductive material.

32. The memory device of claim 27 wherein the first digit line of a column of memory of the memory array is coupled to a respective sense amplifier through an isolation switch formed adjacent to the first memory sub-array and the second digit line of a column is coupled to the sense amplifier through an isolation switch formed adjacent to the second memory sub-array.

33. The memory device of claim 27 wherein the memory cells of the first and second memory sub-arrays of the memory array comprise memory cells coupled to the first portions of the first and second digit lines of the columns of memory.

34. The memory device of claim 27 wherein the first portion of the second digit line of a column of memory of the memory array is coupled to a respective sense amplifier through the second portion of the second digit line.

35. The memory device of claim 27 wherein the first segments of the first and second digit lines of a column of memory of the memory array extend across approximately one-half of the memory sub-array in which the column is located.

36. A computer system, comprising:
a processor;
a peripheral device bus; and
a memory device, comprising:
a memory array having first and second memory sub-arrays of memory cells, the memory cells of each sub-array arranged in rows and columns of memory cells, each column of memory having first and second digit lines coupled to a sense amplifier, each digit line having first and second digit line portions, the columns of memory of the first memory sub-array having the first digit line portions of the first and second digit lines associated with the first memory sub-array, the second digit line portion of the first digit line associated with the first memory array, and the second digit line portion of the second digit line associated with the second memory sub-array;
an address decoder receiving a memory address at an external terminal, the address decoder being operable to activate a row and column in the array corresponding to the memory address; and
a data path operable to couple read data from an external terminal to the memory array and write data from the memory array to the external terminal.

37. The computer system of claim 36 wherein the columns of memory of the second memory sub-array comprise first and second digit lines having first and second digit line portions, the first digit line segments of the first and second digit lines of the columns of the second memory sub-array disposed in the second memory cell region, the second digit line segment of the first digit line of the columns of the second memory sub-array disposed in the second memory cell region, and the second digit line segment of the second digit line of the columns of the second memory sub-array disposed in the first memory cell region.

38. The computer system of claim 36 wherein the first digit line segments of the first and second digit lines of a column of memory of the memory array comprise buried digit lines and the second digit lines segments of the first and second digit lines of a column of memory comprise digit lines formed from a metal material.

39. The computer system of claim 36 wherein the memory cells of the first and second memory sub-arrays of the memory array comprise memory cells having a $6F^2$ semiconductor structure.

40. The computer system of claim 36 wherein the first digit line segments of the first and second digit lines of a column of memory of the memory array comprise digit lines formed from a first conductive material and the second digit line portions of the first and second digit lines of a column comprise digit lines formed from a second conductive material.

41. The computer system of claim 36 wherein the first digit line of a column of memory of the memory array is coupled to a respective sense amplifier through an isolation switch formed adjacent to the first memory sub-array and the second digit line of a column is coupled to the sense amplifier through an isolation switch formed adjacent to the second memory sub-array.

42. The computer system of claim 36 wherein the memory cells of the first and second memory sub-arrays of the memory array comprise memory cells coupled to the first portions of the first and second digit lines of the columns of memory.

43. The computer system of claim 36 wherein the first portion of the second digit line of a column of memory of the memory array is coupled to a respective sense amplifier through the second portion of the second digit line.

44. The computer system of claim 36 wherein the first segments of the first and second digit lines of a column of memory of the memory array extend across approximately one-half of the memory sub-array in which the colunm is located.

45. A method for forming columns of memory cells having first and second digit lines for an array of memory cells, the method comprising:

forming first digit line segments to which the memory cells are coupled of the first and second digit lines in a first memory array region;

forming a second digit line segment of the first digit line in the first memory array region; and forming a second digit line segment of the second digit line extending into a second memory array region non-adjoining the first memory array region.

46. The method of claim 45 wherein forming the first digit line segments comprises forming buried digit lines.

47. The method of claim 45 wherein forming the second digit line segments comprises forming a digit line segment from a metal material.

48. The method of claim 45 wherein forming the first digit line segments comprises forming a digit line segment from a first conductive material and forming the second digit line segments comprises forming a digit line segment from a second conductive material.

49. The method of claim 45 wherein forming the first digit line segments comprises forming first digit line segments extending across substantially one-half of the memory array in which the first digit line segment is located.

50. A method for sensing a column of memory cells for an array of memory cells having at least first and second memory sub-arrays in which the memory cells are arranged in rows and columns, the method comprising:

activating a row of memory of the first memory sub-array;

coupling a first digit line of the column of memory cells in the first memory sub-array to a respective sense amplifier, the first digit line having a first digit line portion to which memory cells of the colunm are coupled and further having a second digit line portion, both digit line portions located in the first memory sub-array;

coupling a second digit line of the column of memory cells in the first memory sub-array to the respective sense amplifier, the second digit line having a first digit line portion to which memory cells of the column located in the first memory sub-array and further having a second digit line portion extending into the second memory sub-array; and detecting and amplifying a voltage difference between the first and second digit lines.

51. The method of claim 50 wherein the first digit line portions comprise forming buried digit lines.

52. The method of claim 50 wherein the second digit line portions comprise forming a digit line segment from a metal material.

53. The method of claim 50 wherein the first digit line portions comprise digit line portions formed from a first conductive material and the second digit line portions of the first and second digit lines comprise digit line portions formed from a second conductive material.

54. The method of claim 50 wherein the first digit line portions comprise forming first digit line segments extending across substantially one-half of the memory array in which the first digit line segment is located.

* * * * *

UNITED STATES PATENT AND TRADEMARK OFFICE
CERTIFICATE OF CORRECTION

PATENT NO. : 6,975,552 B2
APPLICATION NO. : 10/644610
DATED : December 13, 2005
INVENTOR(S) : Tae H. Kim It is certified that error appears in the above-identified patent and that said Letters Patent is hereby corrected as shown below:

| Column, Line | Reads | Should Read |
|---|---|---|
| Item (57), Line 3 | "and an open line" | --and open line-- |
| Column 1, Lines 45, 50 and 52 | "complimentary" | --complementary-- |
| Column 2, Line 40 | "pair is surrounded" | --pair being surrounded-- |
| Column 4, Line 30 | "to which portion of a digit line memory cells are" | --to which portions of a digit line of memory cells are-- |
| Column 4, Line 41 | "aspects of a open digit line" | --aspects of an open digit line-- |
| Column 4, Line 64 | "array 10, thus, coupling" | --array 10, thus coupling-- |
| Column 5, Line 57 | "memory arrays, thus," | --memory arrays, thus-- |
| Column 5, Line 59 | "to active column 50, 80" | --to active columns 50, 80-- |
| Column 6, Line 27 | "but are instead, shifted" | --but are instead shifted-- |
| Column 6, Line 41 | "are desired. For example," | --are desired; for example,-- |

UNITED STATES PATENT AND TRADEMARK OFFICE
CERTIFICATE OF CORRECTION

PATENT NO. : 6,975,552 B2
APPLICATION NO. : 10/644610
DATED : December 13, 2005
INVENTOR(S) : Tae H. Kim It is certified that error appears in the above-identified patent and that said Letters Patent is hereby corrected as shown below:

| | | |
|---|---|---|
| Column 6, Line 66 | "MDL portion 156. virtue of the data state stored by the" | --MDL portion 156. Consequently, the voltage of the digit line will be altered from the precharge voltage by virtue of the data state stored by the-- |
| Column 7, Line 38 | "of the memory arrays 202*a*, 202*b* is a respective row various" | --of the memory arrays 202*a*, 202*b* is a respective row address latch 226, which stores the row address, and a row decoder 228 which applies various-- |
| Column 14, Line 21 | "cells of the colunm" | --cells of the column-- |

Signed and Sealed this

Twenty-fifth Day of December, 2007

JON W. DUDAS
*Director of the United States Patent and Trademark Office*

UNITED STATES PATENT AND TRADEMARK OFFICE
CERTIFICATE OF CORRECTION

PATENT NO. : 6,975,552 B2
APPLICATION NO. : 10/644610
DATED : December 13, 2005
INVENTOR(S) : Tae H. Kim It is certified that error appears in the above-identified patent and that said Letters Patent is hereby corrected as shown below:

| Column, Line | Reads | Should Read |
|---|---|---|
| Item (57), Line 3 | "and an open digit line" | --and open digit line-- |
| Column 1, Lines 45, 50 and 52 | "complimentary" | --complementary-- |
| Column 2, Line 40 | "pair is surrounded" | --pair being surrounded-- |
| Column 4, Line 30 | "to which portion of a digit line memory cells are" | --to which portions of a digit line of memory cells are-- |
| Column 4, Line 41 | "aspects of a open digit line" | --aspects of an open digit line-- |
| Column 4, Line 64 | "array 10, thus, coupling" | --array 10, thus coupling-- |
| Column 5, Line 57 | "memory arrays, thus," | --memory arrays, thus-- |
| Column 5, Line 59 | "to active column 50, 80" | --to active columns 50, 80-- |
| Column 6, Line 27 | "but are instead, shifted" | --but are instead shifted-- |
| Column 6, Line 41 | "are desired. For example," | --are desired; for example,-- |

UNITED STATES PATENT AND TRADEMARK OFFICE
CERTIFICATE OF CORRECTION

PATENT NO. : 6,975,552 B2
APPLICATION NO. : 10/644610
DATED : December 13, 2005
INVENTOR(S) : Tae H. Kim It is certified that error appears in the above-identified patent and that said Letters Patent is hereby corrected as shown below:

| | | |
|---|---|---|
| Column 6, Line 66 | "MDL portion 156. virtue of the data state stored by the" | --MDL portion 156. Consequently, the voltage of the digit line will be altered from the precharge voltage by virtue of the data state stored by the-- |
| Column 7, Line 38 | "of the memory arrays 202*a*, 202*b* is a respective row various" | --of the memory arrays 202*a*, 202*b* is a respective row address latch 226, which stores the row address, and a row decoder 228 which applies various-- |

UNITED STATES PATENT AND TRADEMARK OFFICE
CERTIFICATE OF CORRECTION

PATENT NO. : 6,975,552 B2
APPLICATION NO. : 10/644610
DATED : December 13, 2005
INVENTOR(S) : Tae H. Kim It is certified that error appears in the above-identified patent and that said Letters Patent is hereby corrected as shown below:

Column 14, Line 21        "cells of the colunm"        --cells of the column--

This certificate supersedes the Certificate of Correction issued December 25, 2007.

Signed and Sealed this

Seventeenth Day of February, 2009

JOHN DOLL
*Acting Director of the United States Patent and Trademark Office*